United States Patent [19]

Porcella

[11] 4,253,182
[45] Feb. 24, 1981

[54] OPTIMIZATION OF ERROR DETECTION AND CORRECTION CIRCUIT

[75] Inventor: Brewster J. Porcella, Tustin, Calif.

[73] Assignee: Sperry Rand Corporation, New York, N.Y.

[21] Appl. No.: 28,213

[22] Filed: Apr. 9, 1979

[51] Int. Cl.³ .................... G06F 11/10; G11C 29/00
[52] U.S. Cl. .................................................. 371/38
[58] Field of Search ................................... 371/38, 51

[56] References Cited

U.S. PATENT DOCUMENTS

| | | | |
|---|---|---|---|
| 3,751,646 | 8/1973 | Geng et al. | 371/51 |
| 3,988,580 | 10/1976 | Warman et al. | 371/38 |
| 4,005,405 | 1/1977 | West | 371/38 |
| 4,020,459 | 4/1977 | Coomer | 371/38 |

*Primary Examiner*—Charles E. Atkinson
*Attorney, Agent, or Firm*—G. Donald Weber, Jr.; Eugene T. Battjer; William E. Cleaver

[57] ABSTRACT

There is provided an error detection and correction circuit which is optimized in terms of the operation, part count and the like. This invention includes parity generator circuitry to generate parity signals in accordance with a variation of the Hamming Code in response to the application of a plurality of input data bits. The parity signals are applied to a memory bus during a write cycle. During a read cycle, the parity generators produce a parity error signal, if appropriate, to indicate an error in parity. The error correction circuit receives the data bits from the memory (or memory bus) along with the parity error signals generated by the parity generator circuit portion. The data signals and parity error signals are gated together and supplied to Exclusive-OR gates. If an error is indicated by the level of the input signal, the Exclusive-OR gate converts the signal thereby correcting the erroneous data bit. The circuit further provides means for checking the parity of the parity bits, per se, thereby to provide a double bit error check.

13 Claims, 4 Drawing Figures

|    | P0 | P1 | P2 | P3 | P4 | P5 |
|----|----|----|----|----|----|----|
| M0 | X  | X  | X  |    |    |    |
| M1 | X  |    | X  | X  |    |    |
| M2 |    | X  | X  | X  |    |    |
| M3 | X  | X  |    |    | X  |    |
| M4 | X  |    | X  |    | X  |    |
| M5 | X  |    |    | X  | X  |    |
| M6 |    | X  |    | X  | X  |    |
| M7 |    |    | X  | X  | X  |    |
| M8 | X  | X  |    |    |    | X  |
| M9 | X  |    | X  |    |    | X  |
| M10|    | X  | X  |    |    | X  |
| M11|    | X  |    | X  |    | X  |
| M12|    |    | X  | X  |    | X  |
| M13| X  |    |    |    | X  | X  |
| M14|    | X  |    |    | X  | X  |
| M15|    |    |    | X  | X  | X  |

OPTIMIZATION OF ERROR DETECTION AND CORRECTION CIRCUIT

BACKGROUND OF THE INVENTION

1. Field of the Invention

This invention is directed to computer circuits, in general, and to error detection and correction circuits using 5 parity trees, in particular.

2. Prior Art

The reliability of solid-state electronic circuits has greatly improved during the past decade. Despite this improvement, however, digital system designers are still concerned with system reliability during the hardware design phase. The designer has a number of design options that will improve the reliability and maintainability of the fundamental system. One such option is to duplicate the entire system. The cost of this approach is virtually prohibitive and is used only in designs where the highest degree of reliability is required. A more common approach is to add only enough extra (nonessential) hardware to allow detection of the most common types of system errors. For example, the hardware necessary to add a single extra bit to the system word is often provided. This extra bit, called the "parity bit", allows the detection of an error that affects only a single bit (or an odd number of bits) of the system word. The error could be caused by hardware failure, noise on the transmission line, or the like. The information to be placed into this parity bit is chosen so that the "parity word", consisting of the original system word plus the parity bit, contains an odd number of "1's" (odd parity) or an even number of "1's" (even parity).

The function of a parity generator is to examine the system word and calculate the information required for this added parity bit. Once the parity bit has been included, the "parity word" can be examined after any transmission to determine if a failure or error has occurred.

A parity detection circuit (parity checker) examines the parity word to see if the desired odd or even parity still exists. If an error has occurred, the system control can be informed that the system has not functioned properly.

The fundamental operation required in parity generation and detection circuits, viz. that of comparing inputs to determine the presence of an odd or even number of "$1\pm$", can be effectively performed by Exclusive-OR logic circuits. A basic Exclusive-OR circuit performing the function $\bar{A}B + A\bar{B}$ serves to calculate parity over inputs A and B. Exclusive-OR gates, and also Exclusive-NOR gates, can be interconnected to form parity trees and, therefore, perform parity calculations over longer word lengths. Integrated circuits consisting of Exclusive-OR or Exclusive-NOR gates interconnected to form parity trees are available in the art.

A simple parity scheme detects the presence of a single error in a word. If two errors occur, the output does not indicate that an error has occurred. Thus, the above parity scheme will detect an odd number of errors but fail if an even number of errors occurs.

Schemes have been devised that allow the detection and correction of a single error. Such procedures not only have to recognize that an error has occurred, but also detect which bit is in error. Several extra bits must be added to the system word to accomplish this single-error correction. One such scheme is referred to as Hamming parity single-error detection and correction.

A single-error Hamming parity code generator examines the message bits and generates the required parity bits. The generated parity bits are inserted into the message bits in a prescribed manner. This longer "parity word", containing both the original parity bits and the message bits, can now be transmitted or processed. The accuracy of this parity word can be examined later by a single-error Hamming parity detection circuit. The output of the detection circuit indicates the binary position in the parity word of the bit in error provided only a single error has occurred.

PRIOR ART STATEMENT

The most pertinent prior art known to applicant is as follows: "Error Detecting And Error Correcting Codes", R. W. Hamming, Bell System Technical Journal, line 26, number 2, April 1950.

"Error Detection And Correction Using Exclusive-OR Gates And Parity Trees", L. J. Linford, Motorola Application Note AN-496A, May 1972.

SUMMARY OF THE INVENTION

An error detection scheme utilizing a plurality of parity generators and an error correction scheme utilizing a plurality of Exclusive-OR gates is provided. The circuit utilizes a variation of the Hamming Code in such a way that a multi-bit data word can be corrected with only the delay of a particular parity generator, AND gate and Exclusive-OR gate. The unique arrangement of the error detection and correction system permits utilization of a circuit which uses fewer components and operates more quickly than the prior art circuits.

DESCRIPTION OF A PREFERRED EMBODIMENT

Figure 1:
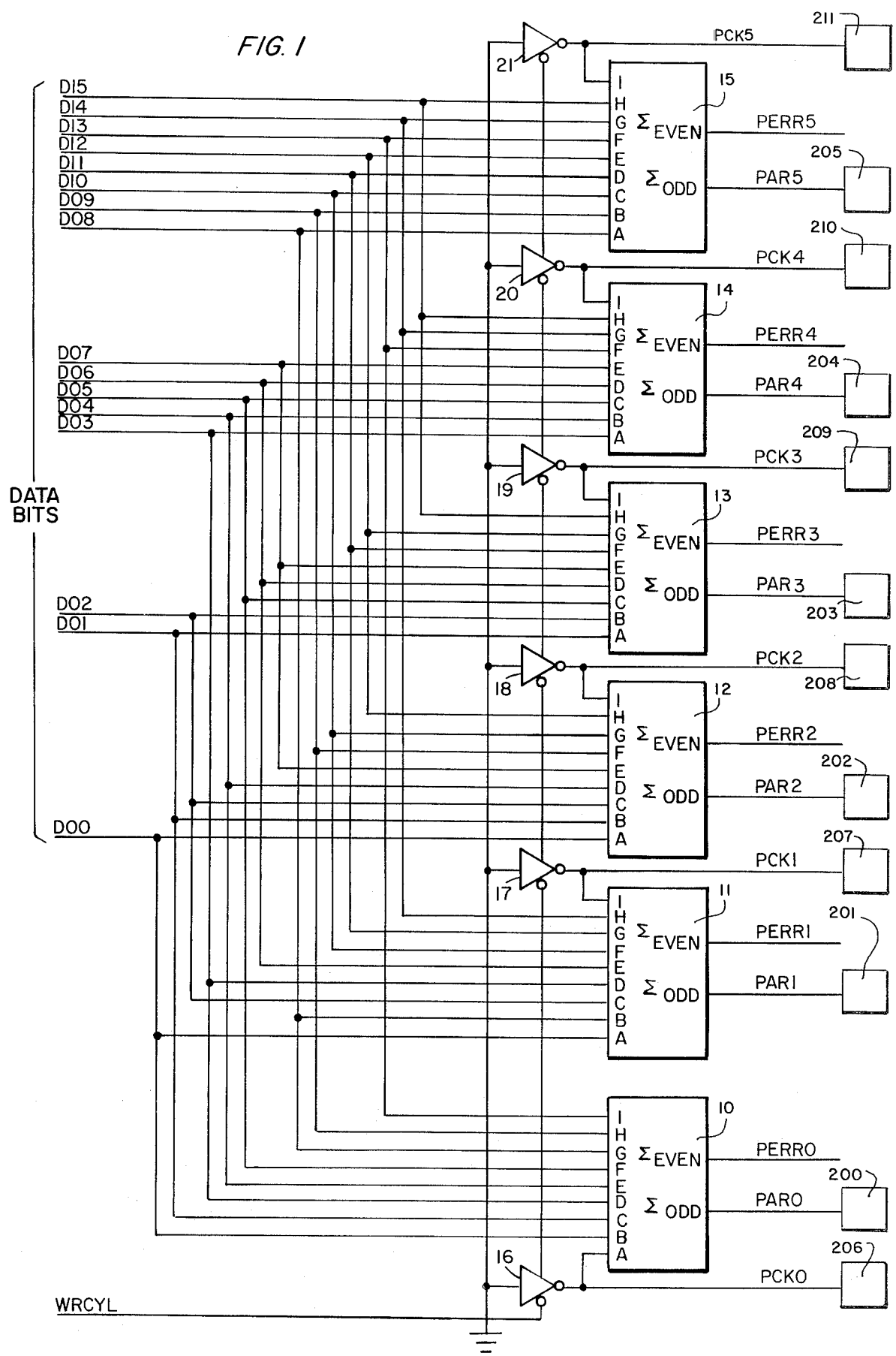
FIG. 1 is a block diagram of the parity generator portion of the circuit.

Referring now to FIG. 1, there is shown a block diagram of the parity generator portion of the circuit of the instant invention. In this illustration, a plurality of data bits are provided from an appropriate source, such as a computer system or the like. In this embodiment, 16 data bits are provided. These data bits are identified as D00 through D15. The data bits are applied to a plurality of parity generators 10–15. Each of the parity generators 10–15 is identical in configuration. In point of fact, each of the parity generators 10–15 is a nine-bit parity tree. These circuits are available in integrated circuit form and may be purchased from many sources such as Motorola. It is noted that each of the generators includes nine input terminals. These input terminals are connected, as seen in FIG. 1, to receive data bits in accordance with a new code described hereinafter. For example, generator tree 10 receives data bits D00, D01, D03, D04, D05, D08, D09 and D13. Other combinations of input data bits are applied to the other parity trees.

In addition, each of the parity generator trees 10-15 receives a signal from either a known logic level (during write operations) or a memory parity bit PCK (during read operations). In particular, the parity generator trees 10-15 receive the logic signal from a respective driver 16 through 21. That is, during the write cycle, drivers 16 through 21 are enabled by the WRCYL signal. Consequently, the ground potential at the input terminal of each driver is inverted and supplied to the parity tree generators. Conversely, in the read cycle, the WRCYL signal is supplied to each of the drivers which are thereby disabled and the ground signal has no effect. In this condition, the parity signals PCK0-PCK5 are returned to input terminals of the associated parity generator trees 10-15. It should be noted that the PCK signals represent the PAR signals previously produced by the parity tree generators as described hereinafter.

When the system is in the write mode, an output signal is produced on the $\Sigma$ odd output terminal of the parity generator trees 10-15. These output signals are defined as parity signals PAR0-PAR5. The parity signals are written into and stored in memory (represented by blocks 200-205) as part of the message word and are representative of the code supplied to the particular parity tree generator. This bit is a binary 1 and is written into memory via the memory bus while the system is in the write mode.

When the parity generator trees 10-15 are in the read mode, a signal PERR0-PERR5 is produced on the $\Sigma$ even output terminal. If the signal is a binary 1, and a parity error is indicated, this signal suggests that one of the data bits which has previously been stored in memory has been retrieved erroneously due to a malfunction in the memory, noise on the line or the like. The PERR signal indicates an error if a binary 1 bit is obtained during the read cycle but the condition of the PERR signal is immaterial during the write mode.

Thus, a plurality of data bits are supplied to the parity generator tree circuit in accordance with the arrangement shown in FIG. 1. In the write cycle, parity signals PAR0-PAR5 are produced in accordance with the parity generator code. The parity signals are stored in memory along with the data bit signals to form a portion of the word stored in the memory. When the machine is in the read mode, the data bits and the parity representing signals (PCK) are retrieved from memory (represented by blocks 206-211) and applied to the parity generator trees along with the write mode signal from the driver circuits. In this situation, the respective parity generator trees produce the parity error signals PERR0-PERR5 in accordance with the signals supplied thereto. The parity error signals are supplied to the error correction circuit of FIG. 2 and the parity error checker circuit of FIG. 3 as described hereinafter.

Figure 2:
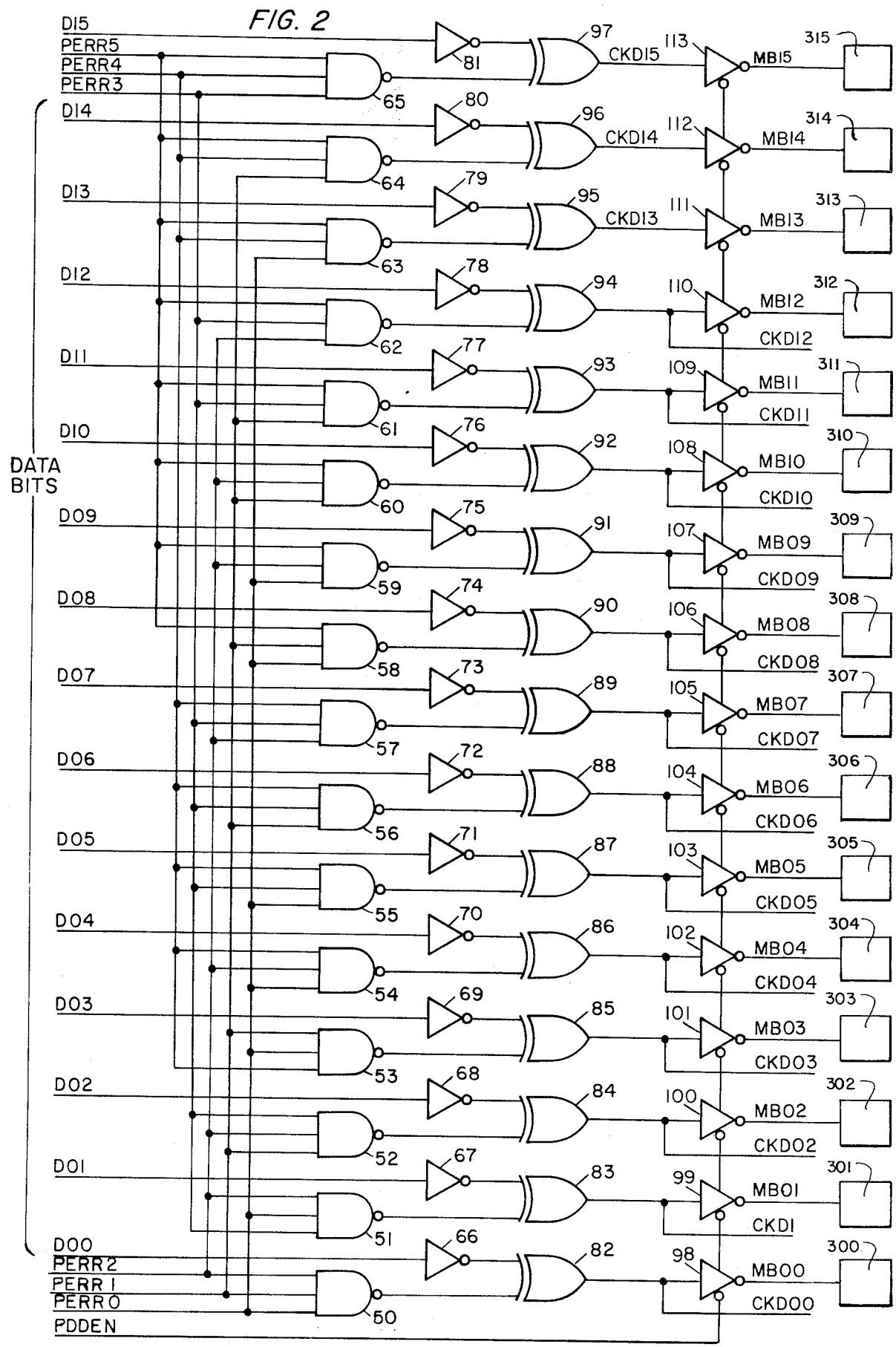
FIG. 2 is a schematic block diagram of the error correction portion of the circuit.

Turning now to FIG. 2, there is shown a block diagram of the error correction circuit. In this circuit portion, a plurality of NAND gates 50-65 are provided. Each of these NAND gates is a three input gate. The NAND gates are connected to receive parity error signals PERR0 through PERR5 in accordance with a prescribed code in the read mode. For example, NAND gate 50 receives parity error signals PERR 0, 1 and 2. Conversely, NAND gate 51 receives parity error signals PERR 0, 2 and 3. The NAND gates, thus, operate to decode the parity error signals to detect if any binary 1 error signals have been produced. In addition, each of the data bit signals D00 through D15 is supplied from the memory during the read cycle and is applied to the input of inverting drivers 66 through 81. The output signals produced by a NAND gate and associated inverter driver are applied to the input terminals of one of the Exclusive-OR gates 80-97. For example, the output signal from NAND gate 50 and the output signal from inverter driver 66 are applied to the input terminals of Exclusive-OR gate 82. Similar connections between the other NAND gates, inverter drivers and Exclusive-OR gates are shown. The Exclusive-OR gate operates to, effectively, invert the data bit applied thereto. For example, assume that the data bit applied to the inverter driver is a high level signal. The inverter driver inverts the signal and supplies a binary 0 signal to the input terminal of the Exclusive-OR gate. If the NAND gate produces a binary 0 (which is indicative of an error condition detected in the parity generator tree), the Exclusive-OR gate produces a binary 0 output. This is the inverse of the erroneous data signal. Conversely, if the input signal is a binary 0, the inverter will produce a binary 1 and the Exclusive-OR gate will produce a binary 1. Thus, in response to an error signal from the NAND gate, the output signal from the Exclusive-OR gate is the inverse of the input data bit.

It is seen that if there is no error produced by the NAND gate, i.e. none of the parity error PERRn signals is in error, the signals produced by the Exclusive-OR gate are not inverted and the data bit is transferred through the circuit.

In the particular example, the output signal from the Exclusive-OR gate is supplied on an output line with a signal designation CKD00 through CKD15. These signals represent the corrected data signals that are supplied to other portions of the circuit or computer system. In addition, the enable signal FDDEN is supplied to the inverter drivers 98 through 113. These circuits are selectively enabled to transfer signals from the error correction circuit to the memory bus as memory bits MB0 through MB15. The signals are then transferred to memory or other circuit by the memory bus represented by blocks 300-315.

Figures 3, 4:
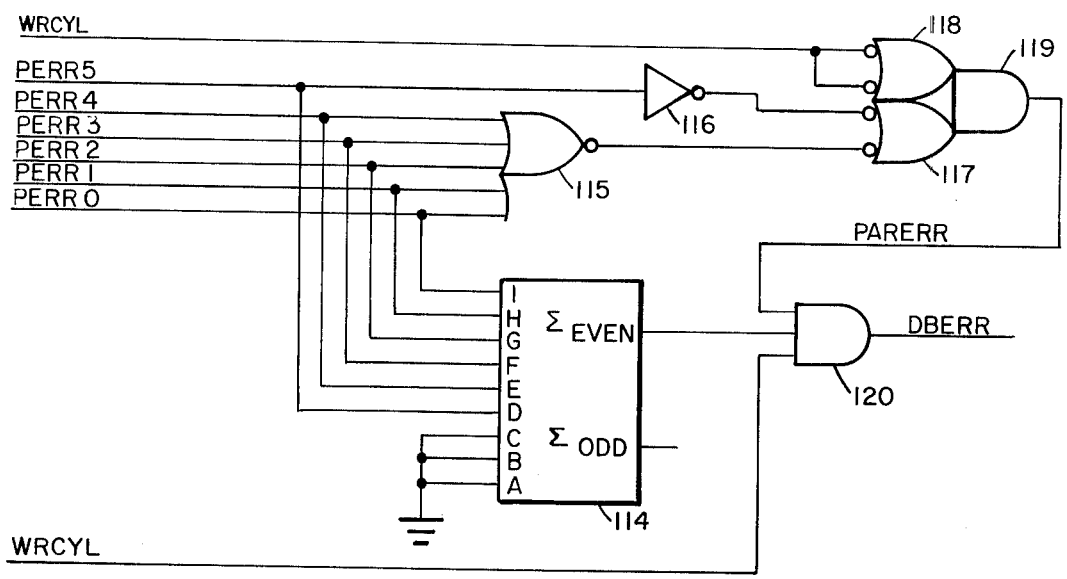
FIG. 3 is a block diagram of the error correction portion of the circuit relating to the multi-bit error feature.
FIG. 4 is a chart showing the generation code used by the instant circuit with a 16 bit message word.

Referring now to FIG. 3, there is shown the portion of the circuit which is specifically directed to the detection of an error in the parity signal or in a double bit error condition. In this circuit portion, a parity generator tree 114 (similar to the parity generator trees shown in FIG. 1) is provided. As shown, several of the inputs are connected to ground while other input terminals are connected to receive respective ones of the parity error bits PERR 0-5. Output terminal $\Sigma$ even is connected to the input terminal of AND gate 120. The output of circuit 114 will be a binary 1 signal only when the parity of the input signals is even which, of course, is an error condition.

In addition, the parity error signals PERR 0-5 are supplied to the input terminals of NOR gate 115. The output terminal of NOR (NAND) gate 115 is connected to one input of inverting NOR gate 117. Parity error signal PERR 5 is connected to an input terminal of driver circuit 116, the output terminal of which is also connected to another input terminal of gate 117. The output terminal of NAND gate 117 is connected to an input of AND gate 119. NAND gate 118 has both input terminals connected to receive the read/write control signal WRCYL. The output terminal of gate 118 is connected to another input terminal of AND gate 119. The output terminal of gate 119 is connected to one input of gate 120. In addition, another input of gate 120 is connected to receive the read/write signal.

The output terminal of AND gate 119 provides the signal PARERR which is the parity error signal when an error is detected in the parity. The output signal DBERR is provided at the output terminal of gate 120 to indicate a double bit error. Gate 120 is enabled, effectively, by the application of the read/write signal in the read mode. If an error signal PARERR is supplied by AND gate 119 and, concurrently, an error signal is produced by circuit 114, gate 120 produces the output signal which indicates that a double bit error has occurred. If either of the inputs to gate 120 is a low signal, (indicative of no error) when the read/write cycle is applied, then the double bit error signal will not be produced inasmuch as there is not a double bit error.

If a parity bit error signal PARERR is produced by gate 119, when the read cycle signal is applied (in the read mode) then an error condition is indicated by NAND gate 117 as a function of the signals applied thereto.

Turning now to FIG. 4, there is shown a chart showing the message (data) bits, the parity bits and the relationship therebetween. The code chart shown in FIG. 4 is illustrative of a word having 16 message bits. The code chart indicates which message bits must be examined to produce the five parity bits which are generated in accordance with the circuit of this invention. An "X" is placed in the chart to indicate which message bits must be examined to generate the corresponding parity bit. For example, parity bit 0 is generated by requiring a combination of bits P0, M0, M1, M3, M4, M5, M8, M9 and M13, to possess even parity. Likewise, parity bit P5 requires an examination of bits P5 and M8–M15. In each parity bit calculation it is seen that 8 message units are examined along with the parity bit. It will be seen that the message units in FIG. 4 which are designated by an X are also the same data bits which are connected to the respective parity tree generators in FIG. 1. This calculation or operation can be performed with a 9-input parity tree which is a standard integrated circuit available in the art.

In the operation of the circuit herein, the parity generator circuit examines the input message bits exactly as the generator portion of the circuit did previously. However, the parity bits generated in the write cycle are compared with the parity bits and the error bits generated during the read cycle. These signals, when supplied to the error correction circuit, automatically correct any erroneous bits and avoid the requirement of a comparison of bits and the various shifting and correcting techniques utilized in the prior art. In addition, the code as provided herein permits the use of existing 9-bit parity generator trees that are available in the art and eliminates the need for any specialized circuitry. Therefore, faster operation is permitted and fewer components are required.

Thus, there has been shown and described an error detection and correction circuit using Exclusive-OR gates and parity trees. All of these components are readily available in the art. The circuit of the instant invention performs the operation of checking parity and, thereby, detecting errors and effectively correcting the errors within the standard operating cycle of the parity checking or generating circuit. The circuit shown and described herein includes a detailed analysis of the circuitry. It is clear that minor modifications to the circuit can be produced by those skilled in the art. However, any such modifications which fall within the purview of this description are intended to be included therein as well. The circuitry and code shown herein is illustrative only and not intended to be limitative. Rather, the scope of the invention is limited only by the claims appended hereto.

Having thus described the preferred embodiment of the instant invention, what is claimed is:

1. An error detection circuit comprising:
   parity generator circuitry;
   input means for supplying input signals to said parity generator circuitry;
   control means for controlling whether said parity generator circuitry is in a read mode and/or a write mode;
   storage means;
   said parity generator circuitry producing parity bits as a function of the applied input signals and supplying said parity bits to said storage means when said parity generator circuitry is in a write mode;
   said parity generator circuitry producing parity error bits as a function of the applied input signals and said parity bits in said storage means when said parity generator circuitry is in a read mode.

2. The error detection circuit recited in claim 1 including error correction means comprising:
   logic circuitry connected to receive said input signals from said input means and said parity error bits from said parity generator circuitry and to produce output signals representative of said input signals;
   said logic circuitry operative to selectively alter the logic state of the input signals as a function of the parity error bit applied thereto whereby an error condition at said input signals is corrected.

3. The error detection and correction circuit recited in claim 2 including:
   driver means connecting the output of said logic circuitry to a memory bus.

4. The error detection and correction circuit recited in claim 2 wherein:
   said logic circuitry includes a plurality of NAND gates connected to said parity generator circuitry to receive said parity error bits therefrom;
   and a plurality of Exclusive-OR gates connected to receive said input signals and the output signals produced by said NAND gates.

5. The error detection and correction circuits recited in claim 4 including:
   inverter means connected to said Exclusive-OR gates for supplying said input signals thereto.

6. The error detection circuit recited in claim 1 wherein:
   said parity generator circuitry comprises a plurality of parity generator trees; and
   said control means includes driver means respectively connected to one input of each of said parity generator trees.

7. The error detection circuit recited in claim 6 wherein:
   said driver means selectively applies a logic level to said parity generator tree in the write mode and is, effectively, disabled in the read mode in response to a read/write mode signal.

8. The error detection circuit recited in claim 1 wherein,
   said storage means includes a memory bus.

9. The error detection circuit recited in claim 2 wherein, said input signals are supplied to said storage means from said input means before being supplied to said logic circuitry.

10. The error detection circuit recited in claim 1 wherein,
said input means comprises a digital computer system.

11. The error detection circuit recited in claim 1 including,
logic means connected to receive said parity error signals produced by said parity generator circuitry to produce a signal which indicates an error in parity.

12. The error detection circuit recited in claim 11 including,
parity generator means connected to receive said parity error signals produced by said parity generator circuitry, and
gate means connected to receive an output signal from said parity generator means and the signal from said logic means to produce an output signal which indicates a multiple bit error.

13. The error detection circuit recited in claim 1 wherein,
said parity generator circuitry is connected to receive input signals and parity bits in accordance with the code shown in FIG. 4.

* * * * *